US010553518B2

(12) United States Patent
Akiyama et al.

(10) Patent No.: US 10,553,518 B2
(45) Date of Patent: Feb. 4, 2020

(54) HEAT DISSIPATION SUBSTRATE AND METHOD FOR PRODUCING SAME

(71) Applicant: Shin-Etsu Chemical Co., Ltd., Tokyo (JP)

(72) Inventors: Shoji Akiyama, Annaka (JP); Yoshihiro Kubota, Annaka (JP); Makoto Kawai, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/398,555

(22) PCT Filed: May 7, 2013

(86) PCT No.: PCT/JP2013/062840
§ 371 (c)(1),
(2) Date: Nov. 3, 2014

(87) PCT Pub. No.: WO2013/168707
PCT Pub. Date: Nov. 14, 2013

(65) Prior Publication Data
US 2015/0108502 A1 Apr. 23, 2015

(30) Foreign Application Priority Data

May 8, 2012 (JP) ................... 2012-106758

(51) Int. Cl.
*H01L 21/02* (2006.01)
*H01L 29/12* (2006.01)
(Continued)

(52) U.S. Cl.
CPC ........ *H01L 23/3735* (2013.01); *H01L 21/187* (2013.01); *H01L 23/3732* (2013.01);
(Continued)

(58) Field of Classification Search
CPC ..... H01L 23/49568; H01L 2224/06519; H01L 2224/09519; H01L 2224/14519;
(Continued)

(56) References Cited

U.S. PATENT DOCUMENTS 5,184,199 A * 2/1993 Fujii ................... H01L 29/1608
257/200
5,373,171 A * 12/1994 Imai et al. ....................... 257/77
(Continued)

FOREIGN PATENT DOCUMENTS

EP 2211380 A2 7/2010
EP 2246878 A1 11/2010
(Continued)

OTHER PUBLICATIONS

International Search Report dated Jun. 4, 2013, issued in corresponding application No. PCT/JP2013/062840.
(Continued)

*Primary Examiner* — Steven H Loke
*Assistant Examiner* — Samuel Park
(74) *Attorney, Agent, or Firm* — Westerman, Hattori, Daniels & Adrian, LLP

(57) ABSTRACT

The present invention relates to a heat dissipation substrate, which is a composite substrate composed of two layers, and which is characterized in that a surface layer (first layer) (1) is configured of single crystal silicon and a handle substrate (second layer) (2) is configured of a material that has a higher thermal conductivity than the first layer. A heat dissipation substrate of the present invention has high heat dissipation properties.

4 Claims, 4 Drawing Sheets

(51) Int. Cl.
*H01L 23/373* (2006.01)
*H01L 21/18* (2006.01)
*H01L 29/16* (2006.01)
*H01L 29/20* (2006.01)

(52) U.S. Cl.
CPC ...... *H01L 23/3738* (2013.01); *H01L 29/1602* (2013.01); *H01L 29/1608* (2013.01); *H01L 29/2003* (2013.01)

(58) Field of Classification Search
CPC . H01L 2224/17519; H01L 2224/30519; H01L 2224/33519; H01L 31/024; H01L 31/052; H01L 33/64; H01L 45/1286; H01L 51/529; H01L 2224/785; H01L 2224/795; H01L 2224/80098
See application file for complete search history.

(56) References Cited

U.S. PATENT DOCUMENTS

| | | | | |
|---|---|---|---|---|
| 7,799,599 B1* | 9/2010 | Sung | ................ | H01L 21/02381 257/352 |
| 7,846,767 B1* | 12/2010 | Sung | ................ | H01L 21/76256 257/77 |
| 2003/0145940 A1* | 8/2003 | Chaudhury | ................ | C09J 5/02 156/272.6 |
| 2005/0236626 A1* | 10/2005 | Takafuji | .............. | H01L 21/6835 257/70 |
| 2006/0113546 A1 | 6/2006 | Sung | | |
| 2006/0276003 A1* | 12/2006 | Celler | ............... | H01L 21/76254 438/455 |
| 2008/0034335 A1* | 2/2008 | Cheng | ............... | H01L 29/66545 257/506 |
| 2008/0087891 A1* | 4/2008 | Sung | ................... | H01L 21/0237 257/43 |
| 2009/0078943 A1 | 3/2009 | Ishida et al. | | |
| 2009/0111242 A1* | 4/2009 | Akiyama | .......... | H01L 21/76254 438/458 |
| 2010/0219418 A1* | 9/2010 | Sung | ..................... | H01L 33/025 257/77 |
| 2012/0074387 A1* | 3/2012 | King | ................ | H01L 21/02381 257/29 |
| 2013/0062640 A1* | 3/2013 | Yen | ......................... | H01L 33/50 257/98 |

FOREIGN PATENT DOCUMENTS

| | | |
|---|---|---|
| JP | 11-255599 A | 9/1999 |
| JP | 2009-076694 A | 4/2009 |
| JP | 2009-231506 A | 10/2009 |
| JP | 2010-189234 A | 9/2010 |

OTHER PUBLICATIONS

Written Opinion dated Jun. 4, 2013, issued in corresponding application No. PCT/JP2013/062840.
European Search Report dated Jan. 18, 2016 issued in counterpart European Patent Application No. 13787763.5, (8 pages).
Office Action dated Dec. 1, 2015, issued in counterpart Japanese application No. 2013-097584 (4 pages).

* cited by examiner

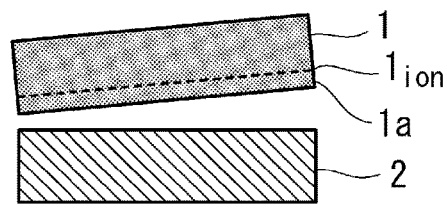
FIG.4A
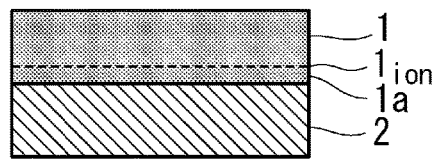
FIG.4B
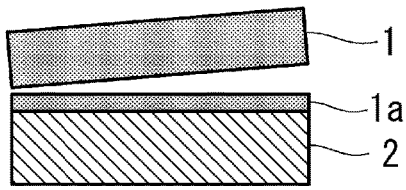
FIG.4C
FIG.5AA FIG.5AB FIG.5AC
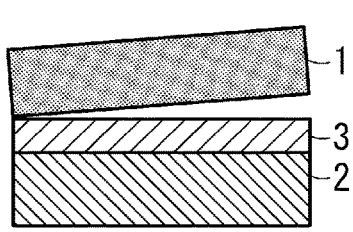 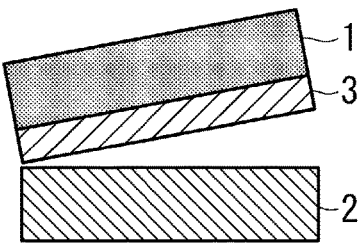 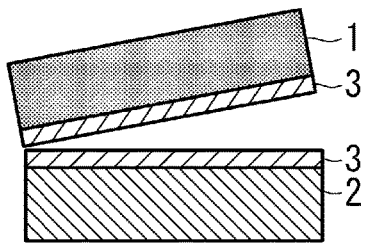
FIG.5B
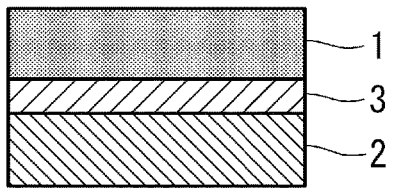
FIG.5C
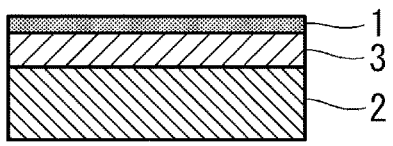

HEAT DISSIPATION SUBSTRATE AND METHOD FOR PRODUCING SAME

TECHNICAL FIELD

This invention relates to a heat dissipating substrate in the form of a silicon composite substrate having a high heat-dissipating ability and a method for preparing the same.

BACKGROUND ART

Recently, silicon semiconductor devices are increasingly improved in performance as their design rule is miniaturized. It is still outstanding how to dissipate heat from discrete transistors and metal interconnects between transistors. To address the problem, several measures are manifested wherein after device fabrication, the silicon substrate on the back surface is thinned to one to several hundreds of microns, and a large fan is mounted on the chip to promote heat dissipation, or a water-cooled tube is arranged therearound.

However, even when the silicon substrate is actually thinned, the region where the device is fabricated (device active layer) extends several microns from the surface, and the remaining region serves as "heat sump." It is thus concluded that the substrate remains less efficient in heat dissipation. Also, SOI wafers used in high-performance processors or the like have the structure including an insulating layer interposed immediately below the device active layer. The insulating layer ($SiO_2$) is difficult to handle from the aspect of heat dissipation because it is a very low thermal conductivity material.

From the aspect of heat dissipation, it is believed desirable to arrange an efficient heat-dissipating material immediately below the device active layer.

SUMMARY OF INVENTION

Technical Problem

An object of the invention, which has been made under the above-mentioned circumstances, is to provide a heat dissipating substrate having a high heat-dissipating ability and a method for preparing the same.

Solution to Problem

Making intensive efforts to attain the above object, the inventors have found that a substrate of two or three layer structure as defined below has a high heat-dissipating ability.

Specifically, the invention provides a heat dissipating substrate and a method for preparing the same, as defined below.

[1] A heat dissipating substrate which is a composite substrate consisting of two layers, wherein a surface layer (first layer) is composed of single crystal silicon and a handle substrate (second layer) is composed of a material having a higher thermal conductivity than the first layer.

[2] The heat dissipating substrate of [1] wherein the material of the second layer is composed of aluminum nitride, silicon carbide or diamond.

[3] A heat dissipating substrate which is a composite substrate consisting of three layers, wherein a surface layer (first layer) is composed of single crystal silicon, a handle substrate (second layer) is composed of a material having a higher thermal conductivity than the first layer, and an intermediate layer (third layer) is composed of a material having a thermal conductivity which is equal to or higher than the thermal conductivity of the second layer.

[4] The heat dissipating substrate of [3] wherein the materials of the second and third layers are selected from aluminum nitride, silicon carbide, and diamond.

[5] The heat dissipating substrate of [1] which is prepared by bonding the first layer (silicon layer) to the second layer, and thinning the first layer (silicon layer).

[6] The heat dissipating substrate of [3] which is prepared by bonding the first layer (silicon layer), the intermediate layer (third layer), and the second layer, and thinning the first layer (silicon layer).

[7] A method for preparing a heat dissipating substrate, comprising the steps of bonding a silicon layer composed of single crystal silicon to a handle substrate composed of a material having a higher thermal conductivity than the silicon layer, and thinning the silicon layer, thus yielding the heat dissipating substrate in the form of a composite substrate of two layers, the first layer (silicon layer) serving as a surface layer and the second layer (handle substrate).

[8] A method for preparing a heat dissipating substrate, comprising the steps of bonding a silicon layer composed of single crystal silicon, a handle substrate composed of a material having a higher thermal conductivity than the silicon layer, and an intermediate layer composed of a material having a thermal conductivity which is equal to or higher than the thermal conductivity of the handle substrate, so as to construct a multilayer structure of silicon layer/intermediate layer/handle substrate, and thinning the silicon layer, thus yielding the heat dissipating substrate in the form of a composite substrate of three layers, the first layer (silicon layer) serving as a surface layer, the third layer (intermediate layer), and the second layer (handle substrate).

[9] The method of [7] or [8] wherein the step of thinning the silicon layer includes machining and polishing.

[10] The method of [7] or [8] wherein the step of thinning the silicon layer includes ion implantation peeling.

[11] The method of any one of [7] to [10], further comprising the step of effecting plasma activation, ion beam treatment or ozone treatment prior to the bonding step.

Advantageous Effects of Invention

The heat dissipating substrate according to the invention has a high heat-dissipating ability.

BRIEF DESCRIPTION OF DRAWINGS

FIGS. 3A to 3C illustrate one exemplary method for preparing a composite substrate of two-layer structure, wherein FIG. 3A shows layers as furnished, FIG. 3B shows the bonded layers, and FIG. 3C shows thinning of first layer, all in cross-sectional view.

FIGS. 4A to 4C illustrate another exemplary method for preparing a composite substrate of two-layer structure, wherein FIG. 4A shows layers as furnished, FIG. 4B shows the bonded layers, and FIG. 4C shows thinning of first layer, all in cross-sectional view.

FIGS. 5AA to 5C illustrate one exemplary method for preparing a composite substrate of three-layer structure, wherein FIGS. 5AA to 5AC show layers as furnished, FIG. 5B shows the bonded layers, and FIG. 5C shows thinning of first layer, all in cross-sectional view.

DESCRIPTION OF EMBODIMENTS

Figure 1:
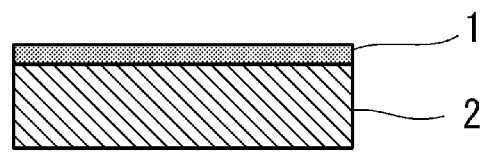
FIG. 1 is a cross-sectional view of a composite substrate according to one embodiment of the invention.
Figure 2:
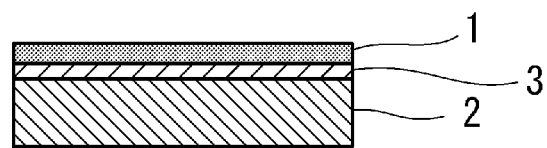
FIG. 2 is a cross-sectional view of a composite substrate according to another embodiment of the invention.

The heat dissipating substrate of the invention has a two-layer structure (FIG. 1) or three-layer structure (FIG. 2) including a surface layer (first layer) of single crystal silicon.

In one embodiment wherein the structure is composed of two layers, an under layer (second layer) 2 disposed below a silicon layer (first layer) 1 has a higher thermal conductivity than silicon.

In another embodiment wherein the structure is composed of three layers, a third layer 3 disposed below a silicon layer (first layer) 1 has a thermal conductivity which is higher than the first layer 1 and higher than or approximately equal to a second layer 2. In addition, the second layer 2 has a higher thermal conductivity than the first layer 1. The reason why the thermal conductivity of the third layer is the highest is that since it is contemplated that heat occurring in the first layer is generated near transistors, conducting the heat in the chip plane uniformly can promote heat dissipation in a pseudo manner.

In both the embodiments, there are several candidate materials for the second and third layers. It is difficult to employ metal materials because of the intended use in the semiconductor application. Materials suited in the semiconductor application include diamond, aluminum nitride, and silicon carbide. Silicon, diamond, aluminum nitride, silicon carbide, and $SiO_2$ have thermal conductivity values as shown below, the values being as measured by the laser flash method to be described later.

| | |
|---|---|
| Si: | 1.5 W/cm · K |
| Diamond: | 10-20 W/cm · K |
| Aluminum nitride: | 1.5-2.0 W/cm · K |
| Silicon carbide: | 2.0-3.8 W/cm · K |
| $SiO_2$: | 0.015 W/cm · K |

Of these, $SiO_2$ having an extremely low thermal conductivity is apparently unsuitable for use as heat-dissipating substrates.

A multilayer structure as mentioned above may be manufactured by several methods. In the case of two-layer structure, a method of manufacturing the structure by bonding a substrate to become a donor substrate (silicon wafer) to a handle substrate is contemplated. In the case of three-layer structure, a method of manufacturing the structure by depositing a material on a donor and/or handle substrate to form a third layer, and bonding the substrates together is contemplated.

Herein, a silicon substrate may be thinned to the desired thickness prior to use. The methods of thinning a silicon layer to become the first layer to the desired thickness include a thinning method of machining and polishing a silicon wafer; and a method of implanting ions into a silicon wafer, followed by bonding and peeling (ion implantation peeling method, for example, ion implantation/mechanical peeling method such as SiGen method).

Figure 3A:
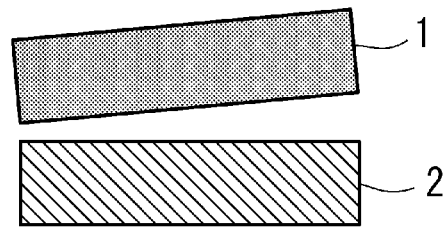
Figure 3B:
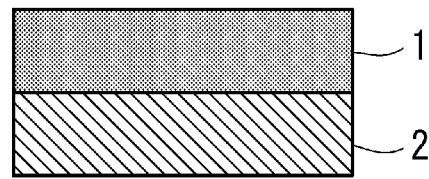
Figure 3C:
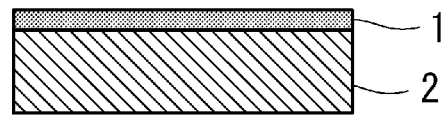

Now referring to FIGS. 3A to 3C, one exemplary method for preparing a two-layer structure is illustrated. A first layer (Si) 1 and a second layer 2 are furnished in FIG. 3A, they are bonded in FIG. 3B, and the first layer 1 is thinned to the desired thickness by machining and polishing in FIG. 3C.

FIGS. 4A to 4C illustrate another exemplary method for preparing a two-layer structure. First, an ion implanted region $1_{ion}$ is formed in one surface of a first layer (Si) 1 in FIG. 4A, the first layer 1 on its ion implanted region $1_{ion}$ side is bonded to a second layer 2 in FIG. 4B, and thereafter, the first layer 1 is peeled at the ion implanted region $1_{ion}$, thereby yielding a composite substrate having a thus thinned first layer (silicon layer) 1a bonded to the second layer 2 in FIG. 4C. Although the method of forming the ion implanted region $1_{ion}$ is not particularly limited, one exemplary method is by implanting a predetermined dose of hydrogen ions or rare gas ions in a sufficient implantation energy amount to form an ion implanted region $1_{ion}$ at the desired depth from the surface of the first layer 1. The depth from the first layer 1 surface (through which ions are implanted) to the ion implanted region $1_{ion}$ (i.e., ion implantation depth) corresponds to the desired thickness of the thinned first layer. Desirably the thickness of ion implanted region $1_{ion}$ (i.e., ion distribution thickness) is such that the layer may be readily peeled by mechanical impact or the like.

FIGS. 5AA to 5C illustrate one exemplary method for preparing a three-layer structure. First, a first layer (Si) 1, a second layer 2, and a third layer 3 are furnished in FIGS. 5AA to 5AC, these layers are bonded in FIG. 5B, and thereafter, the first layer (Si) 1 is thinned to the desired thickness by machining and polishing in FIG. 5C.

In this embodiment, any procedure is acceptable, the second layer 2 having the third layer 3 deposited thereon may be bonded to the first layer 1 (FIG. 5AA); the first layer 1 having the third layer 3 deposited thereon may be bonded to the second layer 2 (FIG. 5AB); or the first layer 1 having the third layer 3 deposited thereon and the second layer 2 having the third layer 3 deposited thereon may be bonded together (FIG. 5AC).

Figure 6A:
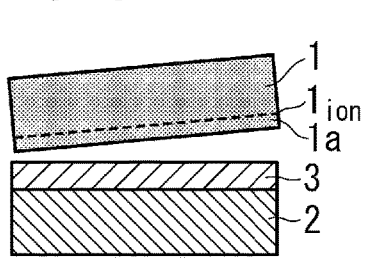
FIGS. 6AA to 6C illustrate another exemplary method for preparing a composite substrate of three-layer structure, wherein FIGS. 6AA to 6AC show layers as furnished.
Figure 6A:
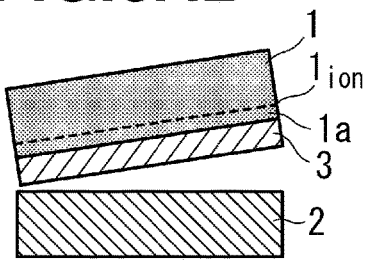
Figure 6A:
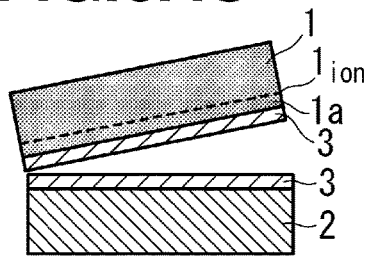
Figure 6B:
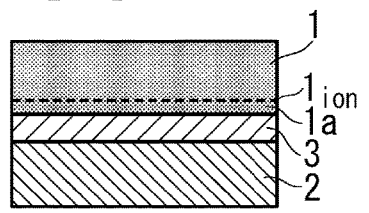
FIG. 6B shows the bonded layers.
Figure 6C:
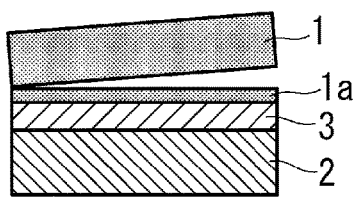
FIG. 6C shows thinning of first layer, all in cross-sectional view.

FIGS. 6AA to 6C illustrate another exemplary method for preparing a three-layer structure. First, an ion implanted region $1_{ion}$ is formed in a first layer (Si) 1 from its bonding surface side in FIGS. 6AA to 6AC, the first layer 1 on its ion implanted region $1_{ion}$ side is bonded to a third layer 3 and a second layer 2 in FIG. 6B, and thereafter, the first layer 1 is peeled at the ion implanted region $1_{ion}$ in FIG. 6C. In this embodiment, any procedure is acceptable, the second layer 2 having the third layer 3 deposited thereon may be bonded to the first layer 1 on its ion implanted region $1_{ion}$ side (FIG. 6AA); the first layer 1 having the third layer 3 deposited thereon at its ion implanted region $1_{ion}$ side may be bonded to the second layer 2 (FIG. 6AB); or the first layer 1 having the third layer 3 deposited on its surface at the ion implanted region $1_{ion}$ side and the second layer having the third layer 3 deposited thereon may be bonded together (FIG. 6AC). In this embodiment, the method of forming the ion implanted region $1_{ion}$ the ion implantation depth, and the ion distribution thickness are the same as in FIGS. 4A to 4C.

In the above embodiments, the first layer of single crystal silicon preferably has a thickness of 1 to 20 μm, especially 1 to 10 μm. Also preferably, the second layer has a thickness of 1 to 800 μm, especially 100 to 750 μm, and the third layer has a thickness of 1 to 30 μm.

It is noted that the invention is not limited to the aforementioned preparation methods. Also, prior to the bonding step, any of well-known surface activating treatments such as ozone water treatment, UV ozone treatment, ion beam treatment, and plasma treatment may be carried out in order to increase the bond strength.

EXAMPLES

Examples and Comparative Examples are given below for illustrating the invention, but the invention is not limited thereto.

Example

In Example, the following composite materials were measured for thermal conductivity. Measurement is by the laser flash method according to JIS R1611-1997. This is achieved by uniformly irradiating pulse laser to single crystal silicon on the front surface for instantaneous heating, and observing a temperature change on the back surface. In the case of a composite substrate, the measurement is an approximation on the assumption that the overall substrate is made of uniform material.

Si/SiC (Si layer has a thickness of 1.0 μm, SiC substrate has a thickness of 625 μm)

Si/SiC/AlN (Si layer thickness 1 μm, SiC layer thickness 1.0 μm, AlN substrate thickness 625 μm)

Si/diamond/SiC (Si layer thickness 1 μm, diamond layer thickness 1.0 μm, SiC substrate thickness 625 μm)

Si/diamond/AlN (Si layer thickness 1 μm, diamond layer thickness 1.0 μm, AlN substrate thickness 625 μm)

The composite materials are prepared by the following methods.

Si/SiC was prepared by the method of FIGS. 3A to 3C.

Si/SiC/AlN was prepared by the method of FIGS. 4A to 4C.

Si/diamond/SiC and Si/diamond/AlN were prepared by the method of FIGS. 6AA, 6B and 6C.

In any of the above substrates, the surfaces of both substrates are subjected to plasma activating treatment to enhance bond strength, prior to bonding.

Figure 7:
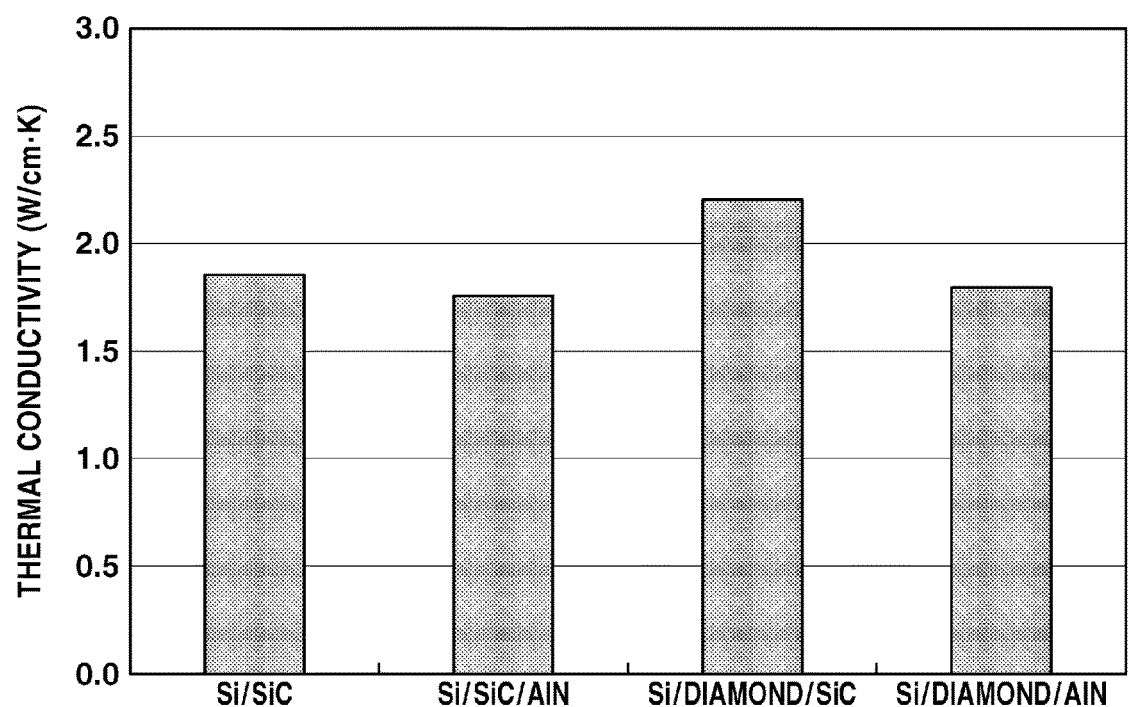
FIG. 7 is a diagram showing the thermal conductivity of samples in Example.

The results are shown in FIG. 7. The values of thermal conductivity are shown below.

| Si/SiC: | 1.85 W/cm · K |
|---|---|
| Si/SiC/AlN: | 1.75 W/cm · K |
| Si/diamond/SiC: | 2.2 W/cm · K |
| Si/diamond/AlN: | 1.78 W/cm · K |

It is demonstrated that all samples have greater heat dissipation than silicon alone.

Comparative Example

In Comparative Example, the following materials were measured for thermal conductivity. Measurement is by the laser flash method as above. This is achieved by uniformly irradiating pulse laser to the front surface for instantaneous heating, and observing a temperature change on the back surface. In the case of a composite substrate (SOI), the measurement is an approximation on the assumption that the overall substrate is made of uniform material.

Silicon (thickness 625 μm)

SOI wafer (SOI layer 1 μm, Box layer 0.5 μm, handle wafer 625 μm) The SOI wafer was obtained by providing a handle wafer which was a single crystal silicon wafer having silicon oxide film formed on its surface and a donor wafer which was a silicon substrate having an ion implanted region formed therein, bonding the handle wafer to the donor wafer via the silicon oxide film, and mechanically peeling the donor wafer at the ion implanted region, thereby transferring the silicon thin film to the handle wafer.

Aluminum nitride (prepared by the CVD method, thickness 625 μm)

Silicon carbide (prepared by the CVD method, thickness 625 μm)

Figure 8:
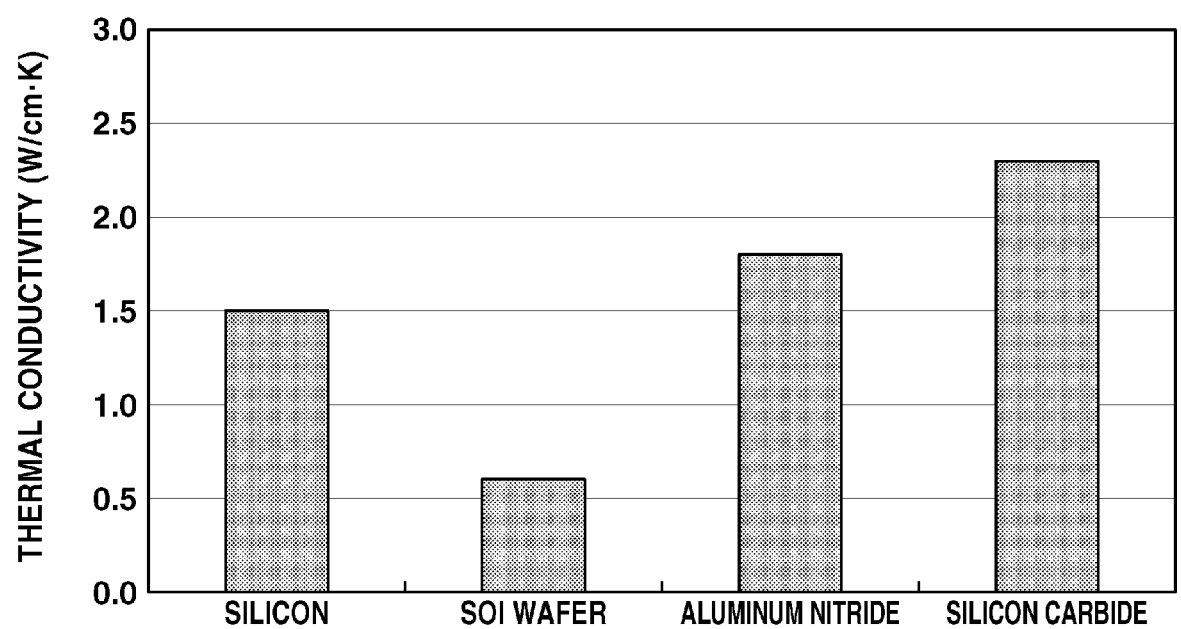
FIG. 8 is a diagram showing the thermal conductivity of samples in Comparative Example.

The results are shown in FIG. 8. The values of thermal conductivity are shown below.

| Silicon (Si): | 1.5 W/cm · K |
|---|---|
| SOI wafer: | 0.6 W/cm · K |
| Aluminum nitride (AlN): | 1.8 W/cm · K |
| Silicon carbide (SiC): | 2.3 W/cm · K |

As to diamond, an estimated value is shown below because bulk substrates are substantially unavailable.

Diamond: 11 W/cm·K

REFERENCE SIGNS LIST

1 first layer (Si)
1a thinned first layer (silicon layer)
1$_{ion}$ ion implanted region
2 second layer
3 third layer

The invention claimed is:

1. A heat dissipating substrate which is a composite substrate consisting of:
   a single crystal silicon layer having a thickness of 1 to 10 μm, wherein the single crystal silicon layer comprises a region where transistors are fabricated as a silicon semiconductor device,
   an AlN handle substrate composed of aluminum nitride and having a thickness of 100 to 750 μm, and
   a SiC intermediate layer between the single crystal silicon layer and the AlN handle substrate, the SiC intermediate layer being composed of silicon carbide and having a thickness of 1 to 30 μm, wherein the SiC intermediate layer has a thermal conductivity which is higher than a thermal conductivity of the AlN handle substrate and is disposed directly on the AlN handle substrate,
   wherein heat occurring in the single crystal silicon layer is conducted to a substrate plane of the AlN handle substrate uniformly via the SiC intermediate layer for dissipating the heat, thereby the heat generated near transistors which are fabricated in the single crystal silicon layer as a silicon semiconductor device is conducted to the AlN handle substrate via the SiC intermediate layer for dissipating the heat, and
   wherein the overall composite substrate has greater heat dissipation than silicon alone.

2. The heat dissipating substrate of claim 1, wherein the heat conductivity from a front surface to a back surface of the overall composite substrate is equivalent to that of aluminum nitride alone.

3. The heat dissipating substrate of claim 1, which is an SOI composite substrate.

4. A method for preparing the heat dissipating substrate of claim 1, comprising the steps of:
   depositing the SiC intermediate layer composed of silicon carbide directly on the AlN handle substrate composed of aluminum nitride, subjecting the surfaces of the SiC intermediate layer on the AlN handle substrate and a silicon wafer composed of single crystal silicon to plasma surface activating treatment to enhance bond strength, prior to bonding, bonding the silicon wafer to the SiC intermediate layer on the AlN handle substrate, wherein the SiC intermediate layer has the thermal conductivity which is higher than the thermal conductivity of the AlN handle substrate, so as to construct a multilayer structure of silicon wafer/SiC intermediate layer/AlN handle substrate, and thinning the silicon wafer to a thickness of 1 to 10 μm, to obtain the single crystal silicon layer, thus yielding the heat dissipating substrate in the form of the composite substrate of three layers, the single crystal silicon layer, the SiC intermediate layer, and the AlN handle substrate.

* * * * *